(12) United States Patent
Xie et al.

(10) Patent No.: US 7,910,023 B2
(45) Date of Patent: Mar. 22, 2011

(54) LITHIUM-CONTAINING SIALON PHOSPHOR AND METHOD OF MANUFACTRING THE SAME

(75) Inventors: Rong-Jun Xie, Tsukuba (JP); Mamoru Mitomo, Tsukuba (JP); Naoto Hirosaki, Tsukuba (JP); Yoshinobu Yamamoto, Tsukuba (JP)

(73) Assignee: National Institute for Materials Science, Tsukuba-Shi, Ibaraki (JP)

( * ) Notice: Subject to any disclaimer, the term of this patent is extended or adjusted under 35 U.S.C. 154(b) by 817 days.

(21) Appl. No.: 11/919,237

(22) PCT Filed: Apr. 27, 2006

(86) PCT No.: PCT/JP2006/309203
§ 371 (c)(1),
(2), (4) Date: Oct. 25, 2007

(87) PCT Pub. No.: WO2006/118321
PCT Pub. Date: Nov. 9, 2006

(65) Prior Publication Data
US 2010/0072498 A1    Mar. 25, 2010

(30) Foreign Application Priority Data

Apr. 28, 2005  (JP) ................................ 2005-133378

(51) Int. Cl.
C09K 11/08 (2006.01)
C09K 11/66 (2006.01)
C09K 11/02 (2006.01)
C09K 11/77 (2006.01)
(52) U.S. Cl. ............ 252/301.4 F; 252/301.4 R; 313/503
(58) Field of Classification Search ............ 252/301.4 R, 252/301.4 F; 313/503
See application file for complete search history.

(56) References Cited

U.S. PATENT DOCUMENTS

| 7,074,346 | B2* | 7/2006 | Yamada et al. ......... 252/301.4 F |
| 7,258,818 | B2* | 8/2007 | Sakata et al. ............. 252/301.4 F |
| 2003/0030038 | A1* | 2/2003 | Mitomo et al. ............... 252/500 |
| 2005/0001225 | A1 | 1/2005 | Yoshimura et al. |
| 2005/0012075 | A1* | 1/2005 | Sakata et al. ............. 252/301.4 F |

FOREIGN PATENT DOCUMENTS

JP    2005-036038    2/2005

* cited by examiner

Primary Examiner — C. Melissa Koslow
Assistant Examiner — Matthew E Hoban
(74) Attorney, Agent, or Firm — Manabu Kanesaka

(57) ABSTRACT

According to the invention, a highly crystalline α-sialon is synthesized to emit highly intense light and a white LED showing an excellent color rendering characteristic is provided by shifting emitted light to the short wavelength side (blue shift). Such an α-sialon is designed so as to be expressed by general formula $(Li_x, Ca_y, Eu_z)(Si_{12-(m+n)}Al_{m+n})(O_n N_{16-n})$ wherein the numerical ranges of x, y, z, m and n are respectively $0<x<2.0$, $0<y<2.0$, $0<z\leq 0.5$ (provided that $0.3\leq x+y+z\leq 2.0$), $0<m\leq 4.0$ and $0<n\leq 3.0$.

8 Claims, 5 Drawing Sheets

LITHIUM-CONTAINING SIALON PHOSPHOR AND METHOD OF MANUFACTRING THE SAME

TECHNICAL FIELD

The present invention of this application relates to a lithium-containing α-sialon phosphor that is optically activated by $Eu^{2+}$ ions. More particularly, the present invention relates to a sialon phosphor that can raise the luminance of a light emitting diode (white LED) that is able to produce white light by mixing yellow light that is emitted from a phosphor when the latter is irradiated with blue light from a blue light emitting diode (blue LED) and excitation light.

BACKGROUND ART

Phosphor materials that have been and are being used in various display apparatus are mainly oxides and sulfides. However, such phosphor materials are still accompanied by problems in terms of stability and light emitting characteristics. Particularly, high energy needs to be exploited from ultraviolet rays and electron beams for such materials to emit visible light. GaInN type blue lasers have been developed in recent years and white LEDs have been and are being developed by using such lasers as sources of excitation light.

Garnet that is an oxide and expressed by chemical formula ((Y, Gd)$_3$ (Al, Ga)$_5$O$_{12}$:Ce), to be referred to as YAG:Ce hereinafter) is known as a material that emits yellow light when irradiated with a blue laser beam. The phosphor is obtained from Y—Al-Garnet by partly substituting Y and Al for Gd and Ga respectively and at the same time doping it with activating ions $Ce^{3+}$ (Non-Patent Document 1). The maximum intensity of emitted light of the yellow phosphor is obtained at or near 550 nm. The yellow phosphor has a problem that it is only possible to obtain pale light when a blue laser beam emitted from it is mixed with excitation light because white light obtained by the mixing contains a red component only to a light extent and thus, the field that can be used is limited in terms of the color rendering characteristic.

Meanwhile, phosphors formed by using a nitride or an oxynitride as host crystal and a rare earth metal as activating metal are attracting attention worldwide. It has been found that an oxynitride produced by replacing part of an oxide by nitrogen for substitution shows a spectrum shifted toward the long wavelength side for excitation light and emitted light from the corresponding spectrum of the oxide because the covalent-bond-originating properties are enhanced (Non-Patent Document 2).

α-$Si_3N_4$ is unstable and turns to the β-type by phase transition at high temperature. However, Li, Ca, Mg, Y or a lanthanide metal interstitially fit into the compound to form a so-called interstitial solid solution. The α-sialon that is produced as a result of such a process is stable at high temperature.

It has been known before this patent application that, when the stabilizing metals interstitially existing in an α-sialon to form a solid solution is partly replaced for substitution by optically active metal ions, the spectrum of the α-sialon is shifted to the long wavelength side to give rise to light emission with a red shift (Non-Patent Documents 3 and 4).

One of the inventors of the present invention (Mitomo) also found that a fluorescent material prepared by using a Ca-α-sialon as base material and doping it with $Eu^{2+}$ turns to a material that emits yellow light when irradiated with visible light in the purple-blue wavelength range (Patent Documents 1 and 2).

This material emits yellow light when blue light, which shows the complementary color of yellow, is irradiated from a blue LED as excitation light so that it is found that it can be used as phosphor for a white light LED when two lights are mixed with each other (Patent Document 3).

However, the above listed materials still have a problem that the extent to which $Eu^{2+}$ is interstitially fitted into the lattice of α-sialon is still small and hence the intensity of light emitted from them is not satisfactory. A phosphor obtained by doping an Li-α-sialon with $Eu^{2+}$ is also disclosed (Patent Document 4), although the intensity of light emitted from it does not get to any practical level. This is presumably because a solid solution reaction takes place at high temperature and hence the added Li and Eu interstitially fit into the lattice only to a small extent.

The α-sialon is a solid solution of α-$Si_3N_4$. There are two large spaces having a diameter of about 0.1 nm in each unit interstice of the crystal structure of α-$Si_3N_4$. Then, the crystal structure is stabilized as metal atoms interstitially fit into the spaces of α-$Si_3N_4$ to form a solid solution. Therefore, the general formula of lithium-containing α-sialon is $(Li_x, M_y)$ $(Si_{12-(m+n)}Al_{m+n})(O_nN_{16-n})$ and hence the number of metal atoms (x+y) that can be interstitially fitted into each unit space to form a solid solution is two at most.

The value of m in the general formula of α-sialon corresponds to the number of Al—N bonds that is substituted for the Si—N bonds of the α-$Si_3N_4$ structure and is expressed by m=x+δy (where δ is the valence number of the metal M). Then, n in the general formula represents the number of Al—O bonds that is substituted for the Si—N bonds. Metal-nitrogen bonds take a major part in the α-sialon and hence the α-sialon is a solid solution showing a high nitrogen content ratio.

The electric neutrality is maintained by the lattice substitution and the metal fit-in type solid solution phenomenon. The wavelength of excitation light and that of emitted light of an α-sialon having a particular composition are shifted (red shift) to the long wavelength side due to the characteristics of the crystal structure and the nitrogen-rich chemical composition thereof.

When $Si_3N_4$—AlN—$Eu_2O_3$—CaO mixture powder is heated in a nitrogen gas flow at 1,750° C. to 1,850° C., a lower melting point liquid is produced out of it. Then, the solid and the liquid phase react with each other when heated further or as time passes to ultimately produce an $Eu^{2+}$-doped Ca-α-sialon. The trivalent Eu that is added in the heating process is reduced to become divalent Eu which is optically active. With conventional materials of the above-described type, the reaction does not proceed satisfactory because the quantitative ratio of the transitional liquid phase is small and the melting point is high.

Meanwhile, white LEDs are being used in the field where reliability is essential such as security lights and signal lights, in the field where lightweight and downsizing is required such as car-borne lights and the backlights of mobile phones and in the field where visibility is vital such as guide plates in railway stations.

Such white LEDs are adapted to emit white light by mixing lights of different colors. More specifically, blue light emitted from a light emission source, which is a blue LED, with a wavelength of 380 nm to 480 nm and yellow light emitted from a phosphor are mixed to produce white light. The phosphor that is good for use for a white LED is thinly coated on the surface of a blue LED, that operates as light emission source.

REFERENCE DOCUMENTS

Patent Document 1: JP 2001-171831-A
Patent Document 2: JP 2002-149022-A

Patent Document 3: JP 2002-349286-A
Patent Document 4: JP 2002-228081-A
Non-Patent Document 1: Mukai and Nakamura, "White and UV LEDs", OYO BUTURI, 68, 152-55 (1998)
Non-Patent Document 2: J. W. H. van Krevel et al., "Long wavelength Ca3+ emission in Y—Si—O—N materials", J. Alloys and Compounds, 268, 272-277 (1998)
Non-Patent Document 3: J. W. H. van Krevel et al., "Luminescence properties of terbium-, cerium- or europium-doped α-sialon materials", J. Solid State Chem. 165, 19-24 (2002)
Non-Patent Document 4: R. J. Xie et al., "Preparation and Luminescence spectra of calcium- and rare-earth—(R=Eu, Tb and Pr) codoped α-SiAlON ceramics", J. Am. Ceram. Soc. 85, 1229-1234 (2002)
Non-Patent Document 5: R. J. Xie et al., "Preparation of Ca-α-SiAlON ceramics with composition along the Si3N4-1/2Ca3N2:3 AlN line", Z. Metallkd. 92, 931-936 (2001)

DISCLOSURE OF THE INVENTION

Problem to be Solved by the Invention

YAG:Ce oxide phosphors generally have drawbacks including that the spectral intensity falls remarkably when the wavelength of excitation light exceeds 450 nm and that they emit pale light and it is not possible to obtain warm white color from them because the emission spectrum thereof has long wavelength components only to a small extent.

The α-sialon phosphor that the inventors of the present invention have already developed (Patent Documents 1 and 2) is an $Eu^{2+}$-doped Ca-α-sialon. Contrary to YAG:Ce phosphors, it has short wavelength components only to a small extent and hence can produce only warm white color.

Both Ca-α-sialon (Patent Documents 1 and 2) and $Eu^{2+}$-doped Li-α-sialon (Patent Document 4) have a problem that the light emission intensity is still low.

α-sialons produced by conventional materials have only a small difference between the reaction temperature and the melting point of the liquid phase and hence the reaction does not proceed satisfactorily so that they require a long processing time and high temperature for raising the light emission intensity.

In view of the above-identified circumstances, it is therefore an object of the present invention to synthetically provide a highly crystalline α-sialon from a starting composition that is doped with lithium simultaneously by way of a low melting point liquid phase in order to achieve a high intensity emission of light.

Another object of the present invention is to manufacture a white LED showing an excellent color rendering characteristic by way of simultaneous doping of $Eu^{2+}$ and $Li^+$ and shifting emitted light to the short wavelength side (blue shift).

Means for Solving the Problem

The inventors of the present invention acquired a technological finding that a lithium-containing starting material produces a transitional liquid phase at low temperature to increase the extent for forming a solid solution and improve the perfection of crystallinity so as to consequently raise the intensity of emitted light and that emitted light shows a blue shift. The present invention is based on the above finding.

In the first aspect of the present invention, there is provided a lithium-containing sialon phosphor of α-sialon expressed by general formula $(Li_x, Ca_y, Eu_z)(Si_{12-(m+n)}Al_{m+n})(O_nN_{16-n})$ wherein the numerical ranges of x, y, z, m and n are respectively $0<x<2.0$, $0<y<2.0$, $0<z\leq0.5$ (provided that $0.3\leq x+y+z\leq2.0$), $0<m\leq4.0$ and $0<n\leq3.0$. Preferably, the ranges are $0<x<1$, $0<y<1$, and $0<z\leq0.3$.

In the second aspect of the invention, there is provided a lithium-containing sialon phosphor of α-sialon having an additional solid-soluble metal and expressed by general formula $(Li_x, (Ca, M_y), Eu_z)(Si_{12-(m+n)}Al_{m+n})(O_nN_{16-n})$ wherein the numerical ranges of x, y, z, m and n are respectively $0<x<2.0$, $0<y<2.0$, $0<z\leq0.5$ (provided that $0.3\leq x+y+z\leq2.0$), $0<m\leq4.0$ and $0<n\leq3.0$ and M is Mg, Y, a lanthanide metal or a mixture of two or more than two of them.

In the above compositions, $0<x<2.0$ and $0<y<2.0$ because there is no effect of adding the element or elements at 0 and no solid solution appears when either of them is greater than 2.0 and $0<z\leq0.5$ because no emission of light takes place at 0 and the light emission intensity falls due to concentration quenching when z is greater than 0.5.

As for the total amount of the metal elements interstitially fitted into the lattice, $0.3\leq x+y+z\leq2.0$ because the α structure is not stable when less than 0.3 and the metal elements do not interstitially fit into the lattice remarkably and the second phase come to coexist when the total exceeds 2.0. When the above range is observed, the values of m and n in the above general formulas respectively become $0<m\leq4.0$ and $0<n\leq3.0$.

The above phosphors can be synthetically produced by heating $Si_3N_4$—AlN—$Li_2O$—$Eu_2O_3$—CaO mixture powder (the starting material for the first aspect of the invention) and $Si_3N_4$—AlN—$Li_2O$—$Eu_2O_3$—CaO-MO mixture powder (the starting material for the second aspect of the invention, where MO is an oxide of Mg, Y, a lanthanide metal or two or more than two of them) at 1,500° C. to 2,000° C. for 0.5 to 48 hours in a nitrogen atmosphere respectively.

Preferably, the starting materials are heated at 1,750° C. to 1,900° C. for 1 to 10 hours. Part of the silicon nitride of the starting materials is thermally dissociated when the starting materials are heated at a high temperature above 1,750° C. so that they are heated under high pressure of 5 to 10 atmosphere. For $Li_2O$ and CaO, carbonates or the like that produce them by pyrolysis are normally used.

When the starting materials do not contain any Li compound, mixture powders that corresponds to the respective starting materials, or $Si_3N_4$—AlN—$Eu_2O_3$—CaO mixture powder and $Si_3N_4$—AlN—$Eu_2O_3$—CaO-MO mixture powder (MO is oxide of Ca, Mg, Y, a lanthanide metal or a mixture of two or more than two of them) are heated, while by adding $Li_2O$, $Li_2CO_3$ or $Li_3N$ by 0.05 wt % to 20 wt % as a flux to obtain a similar result because part of the added lithium compound interstitially fits into the lattice to produce a solid solution.

When either of the starting materials, which are mixtures, is heated to high temperature, $Li_2O$—EuO—CaO or $Li_2O$—EuO—CaO-MO and a transitional liquid phase having a low melting point are produced and the reaction proceeds at low temperature. The liquid phase interstitially fits into particles of α-sialon to produce a solid solution as time advances and the component remaining on grain boundaries is reduced.

In the third aspect of the present invention, there is provided a lithium-containing α-sialon that is a pure nitride expressed by $(Li_x, Ca_y, Eu_z)(Si_{12-m}Al_m)(N_{16})$. For a Ca-α-sialon, the use of a pure nitride for the solid solution is more advantageous than the use of an oxygen in terms of allowable compositional range of solid solution (Non-Patent Document 5). Therefore, the above-defined composition that contains Li shows a wide allowable compositional range so that it is possible to achieve a high light emission intensity by means of such a composition. In the above compositions, 0<x<2.0 and 0<y<2.0 because there is no effect of adding the element or elements at 0 and no solid solution appears when either of them is greater than 2.0 and 0<z≦0.5 because no emission of light takes place at 0 and the light emission intensity falls due to concentration quenching when z is greater than 0.5.

As for the total amount of the metal elements interstitially fitted into the lattice, 0.3≦x+y+z≦2.0 because the α structure is not stable when less than 0.3 and the metal elements do not interstitially fit into the lattice remarkably and the second phase come to coexist when the total exceeds 2.0. When the above range is observed, the value of m in the above general formula becomes 0<m≦4.0.

The above compound can be synthetically produced by heating $Si_3N_4$—AlN—EuN—$Li_3N$ mixture powder, which corresponds to the above general formula, at 1,500° C. to 2,000° C. for 0.5 to 48 hours in a nitrogen atmosphere. Alternatively, $Si_3N_4$—AlN—EuN mixture powder may be heated at 1,500° C. to 2,000° C. for 0.5 to 48 hours, while adding $Li_2O$ or $Li_2CO_3$ by 0.05 wt % to 20 wt % as a flux to obtain a similar result.

In the fourth aspect of the present invention, there is provided a sialon phosphor obtained by substituting metal M (where M is Mg, Y, a lanthanide metal or a mixture of two or more than two of them) for the Ca of an α-sialon in the third aspect of the invention. Such a sialon phosphor can be obtained by adding nitride of the metal (MN) to the composition of the starting material of the third aspect of the invention and heating under similar conditions.

An Li-containing α-sialon according to the present invention shifts both excitation light and emitted light to the long wavelength side and emits highly intense yellow light using a blue laser beam as excitation light. Since an α-sialon according to the present invention has a structure and a composition that are complex if compared with oxide phosphors, the emission spectrum thereof has a wide range. The shift to the long wavelength side of the emission spectrum (red shift) can be indicated by the wavelength that shows the highest intensity.

In the first and second aspects of the present invention, the longest emission wavelength is in a range not less than 560 nm and not more than 590 nm. In the third and fourth aspect of the present invention, the longest wavelength further shifts to the long wavelength side to come into a range not less than 580 nm and not more than 610 nm because the nitrogen content is high.

Since a phosphor according to the present invention is realized by using an α-sialon as base material, it provides advantages of the α-sialon, or the base material, and shows excellent chemical, mechanical and thermal characteristics so that it is stable and can enjoy a long service life as phosphor material.

Additionally, due to the above excellent characteristics, the phosphor can suppress the thermal relaxation phenomenon that can give rise to a loss of excitation energy. Thus, an α-sialon obtained by simultaneously interstitially fitting in $Li^+$ and $Eu^{2+}$ to form a solid solution can lower the reduction ratio of the emission intensity that arises as a function of a temperature rise to consequently broaden the operating temperature range as compared to conventional phosphors. Thus, a phosphor according to the present invention can highly promisingly find a broad scope of application in the field of lighting devices. A lithium-containing α-sialon phosphor according to the present invention is obtained by heating the mixture powder of the starting material at a temperature within a range between 1,500° C. and 2,000° C. in a nitrogen atmosphere. Preferably, the powder of the starting material is mixed in a dry box in which nitrogen is made to flow under reduced partial pressure for oxygen and water vapor pressure.

Once the α-sialon is synthesized by way of a reaction conducted at high temperature, it remains stable without being oxidized if it is exposed to air. The range of reaction temperature between 1,500° C. and 2,000° C. is selected because the reaction proceeds slowly and a long heating time is required when the temperature is lower than 1,500° C., whereas the starting material needs to be heated under high nitrogen pressure in order to suppress the pyrolysis of the starting material when the temperature is higher than 2,000° C., although the reaction proceeds satisfactorily at such high temperature. In the above range, the reaction proceeds satisfactorily under nitrogen pressure between 1 and 10 atmosphere that is used in normal heating furnace and the heating time will be about 0.5 to 48 hours.

Note, however, that it takes long time until the reacting substances complete the reaction and 2% to 10% of unreacted substances can remain as non-crystalline substances depending on the conditions. In other words, the reaction temperature and the reaction time need to be selected appropriately so that any added Li and Eu may not be left on grain boundaries.

According to the present invention, high concentration $Eu^{+2}$ can be substituted for a part of the Li or the solid solution metal (M) of the Li-containing α-sialon that contains nitrogen to a large content ratio so that it is possible to produce a phosphor that emits yellow light with a high luminance by excitation using ultraviolet rays or visible light. The produced phosphor emits light with a wavelength longer than any conventional YAG type materials but shorter than $Eu^{+2}$-doped α-sialons.

Additionally, the produced phosphor emits light with a luminance level higher than materials obtained by simply doping an Li-α-sialon with $Eu^{+2}$. Therefore, a white LED realized by using this material can be made to emit white light of a broad range extending from warm white to cool white simply by changing the content ratio of the phosphor.

Thus, an Li-containing α-sialon produced by simultaneously interstitially fitting in $Eu^{2+}$ to form a solid solution according to the present invention can effectively and feasibly be used for white LEDs.

ADVANTAGES OF THE INVENTION

A lithium-containing α-sialon phosphor according to the present invention shifts its excitation spectrum to the long wavelength side to superpose its wavelength range on the wavelength range (from 400 nm to 480 nm) of light emitted from a blue LED as compared to conventionally available oxide phosphors.

Therefore, it is possible to provide a phosphor that can raise the luminance of white LEDs using a blue LED as source of excitation light.

Additionally, since a lithium-containing α-sialon phosphor according to the present invention emits light with a spectrum range broader than any conventional α-sialon phosphors, it provides an advantage that a single phosphor can provide white light with various color tones.

Therefore, a lithium-containing α-sialon phosphor according to the present invention can find applications in white light emitting devices that can accommodate a wide scope of needs. Still additionally, since an α-sialon according to the present invention is developed as heat-resistant material, it is thermally, mechanically and chemically highly stable. Therefore, the present invention provides an α-sialon phosphor that can operate stably in a rigorous environment and highly resistant to light.

BEST MODE FOR CARRYING OUT THE INVENTION

Now, the present invention will be described in greater detail by way of examples and by referring to the accompanying drawings. Note, however, the examples are given to make the present invention easily understandable and hence by no means limit the present invention.

FIGS. 1 through 8 are graphs illustrating the excitation spectrums and the emission spectrums of the lithium-containing α-sialons of Examples 1, 3, 5, 6, 8, 9, 11 and 12.

Figure 9:
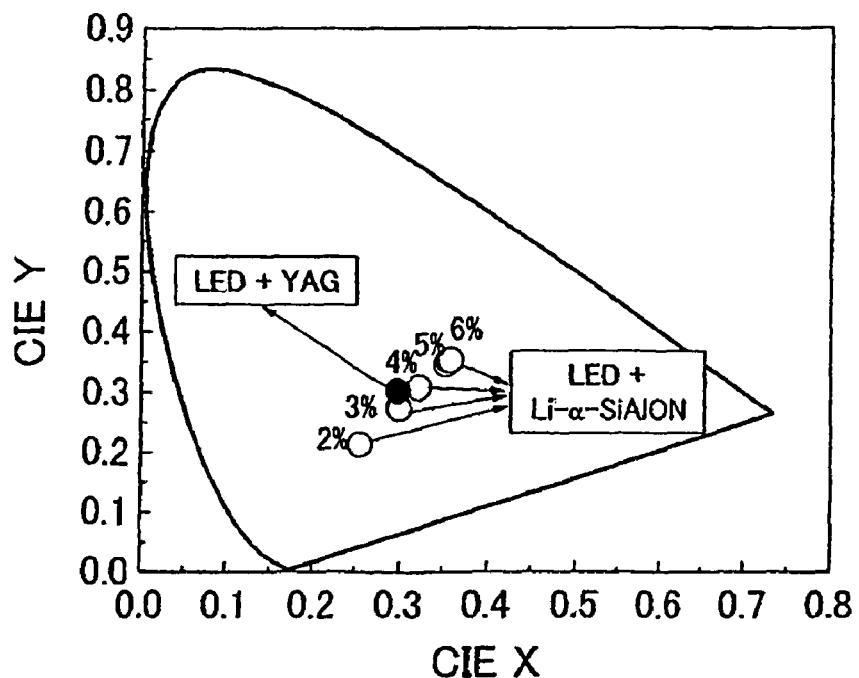
FIG. 9 is a graph illustrating white light obtained by combining a blue LED and the lithium-containing α-sialon of Example 4 and white light obtained by using YAG:Ce, using a color coordinate system.

FIG. 9 is a graph illustrating white light obtained by combining a blue LED and the lithium-containing α-sialon of Example 4 and white light obtained by using YAG:Ce, using a color coordinate system.

Figure 10:
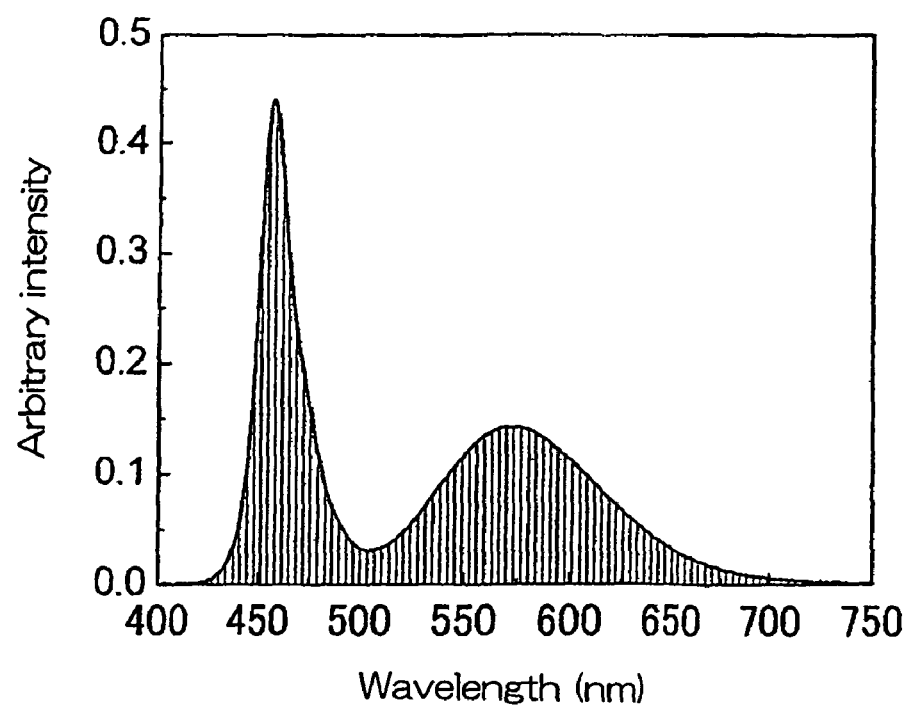
FIG. 10 is a graph illustrating the emission spectrum of white light obtained by combining a blue LED and the lithium-containing α-sialon of Example 4.

FIG. 10 is a graph illustrating the emission spectrum of white light obtained by combining a blue LED and the lithium-containing α-sialon of Example 4.

While the present invention is described in greater detail below by way of examples, they are descried only to make the present invention easily understandable and the present invention is by no means limited by the examples.

Examples 1 to 5

In each of the examples, a starting material of powder of $Si_3N_4$—$AlN$—$Li_2O$—$Eu_2O_3$—$CaO$ (of which $Li_2O$ and $CaO$ were added as carbonates) was mixed and prepared to show a composition expressed by general formula $(Li_x, Ca_y, Eu_z)(Si_{12-(m+n)}Al_{m+n})(O_nN_{16-n})$ according to Table 1 below. Then, the mixture was molded at a rate of 100 kg/cm² in a metal mold having a diameter of 10 mm and then baked in nitrogen under 10 atmosphere.

Subsequently, the product was crushed and the obtained powder was observed for powder X-ray diffraction (X-ray diffractometer: PW1700, tradename, available from Philips). As a result, it was found that the obtained powder substantially contains only an α-sialon. The obtained α-sialon powder sample was observed for fluorescence spectrum (florescence spectrometer: F-4500, tradename, available from Hitachi, Ltd.).

The maximum values of the excitation wavelength, the emission wavelength and the relative emission intensity of each example are shown in Table 2. The excitation spectrums and the emission spectrums of Examples 1, 3 and 5 are illustrated respectively in FIGS. 1, 2 and 3.

TABLE 1

| | chemical composition | | | baking conditions | |
|---|---|---|---|---|---|
| example | x | y | z | temp (° C.) | time (h) |
| 1 | 0.01 | 0.8 | 0.07 | 1850 | 1 |
| 2 | 0.05 | 0.8 | 0.07 | 1800 | 2 |
| 3 | 0.1 | 1.0 | 0.1 | 1800 | 2 |
| 4 | 0.5 | 1.0 | 0.1 | 1800 | 2 |
| 5 | 1.0 | 0.8 | 0.1 | 1850 | 1 |

TABLE 2

| Example | maximum excitation intensity (nm) | maximum emission intensity (nm) | relative emission intensity |
|---|---|---|---|
| 1 | 410 | 584 | 4560 |
| 2 | 419 | 580 | 4000 |
| 3 | 418 | 581 | 4740 |
| 4 | 449 | 578 | 4920 |
| 5 | 442 | 574 | 4130 |

Examples 6 to 7

Figure 1:
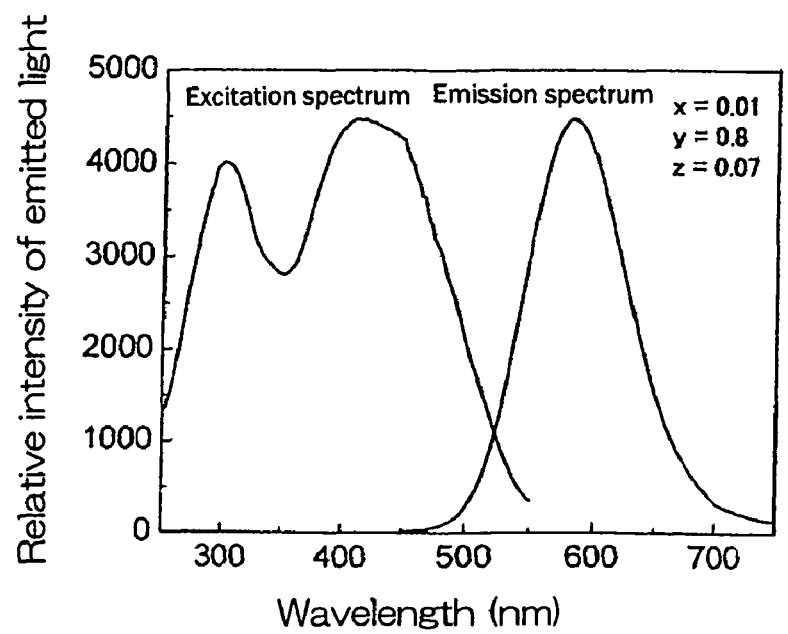
FIG. 1 is a graph illustrating the excitation spectrum and the emission spectrum of the lithium-containing α-sialon of Example 1.
Figure 2:
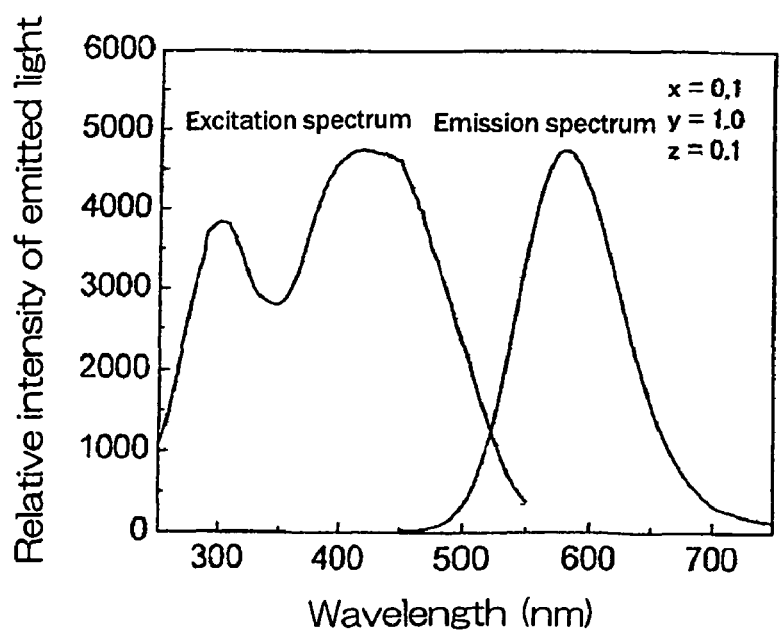
FIG. 2 is a graph illustrating the excitation spectrum and the emission spectrum of the lithium-containing α-sialon of Example 3.
Figure 3:
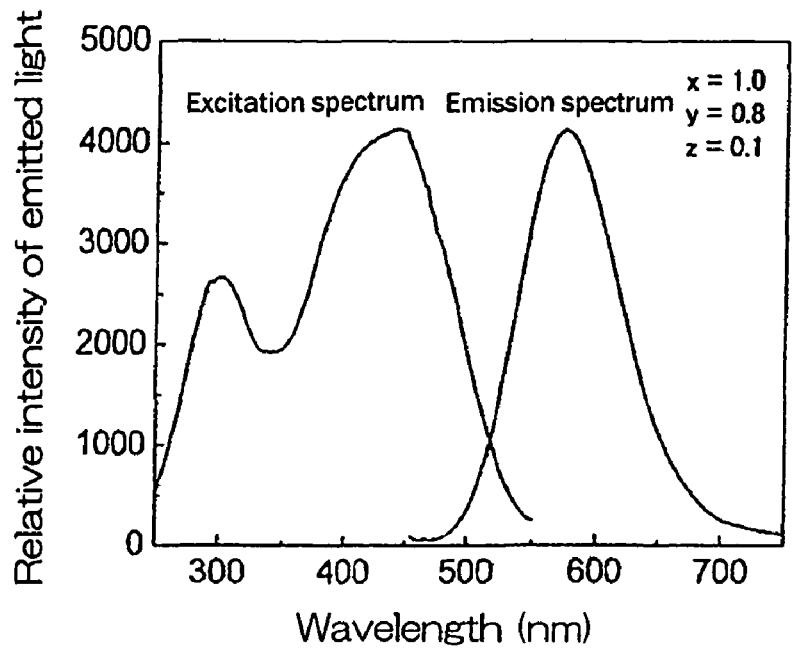
FIG. 3 is a graph illustrating the excitation spectrum and the emission spectrum of the lithium-containing α-sialon of Example 5.
Figure 4:
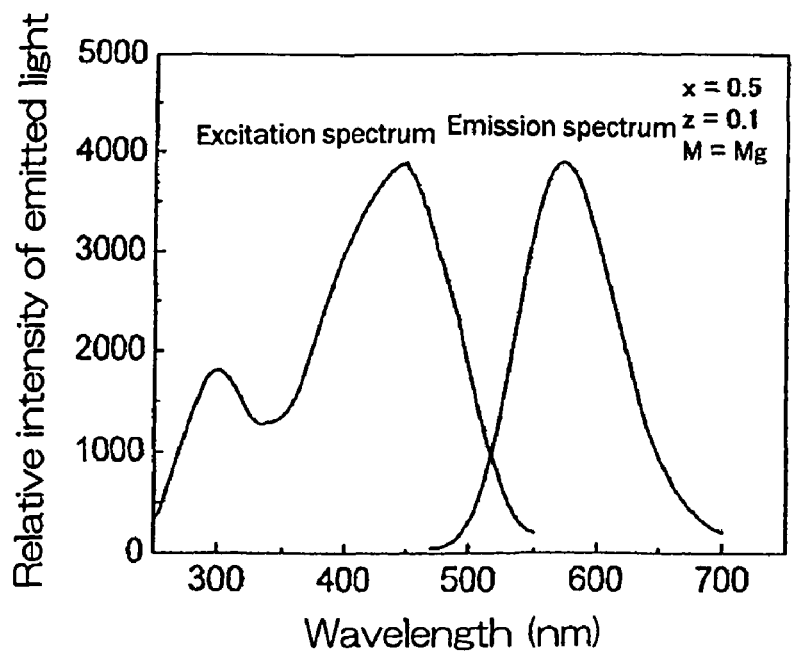
FIG. 4 is a graph illustrating the excitation spectrum and the emission spectrum of the lithium-containing α-sialon of Example 6.

A metal oxide was added to the mixture of $Si_3N_4$—$AlN$—$Li_2O$—$Eu_2O_3$—$CaO$ having the composition of Example 4 so as to make the equivalent of CaO of the mixture show a composition ratio of Ca:M=3:1 to prepare the starting material of each of the samples of this example. Then, the starting material was heated under conditions same as those of Example 4. Table 3 shows the results of adding MgO and those of adding $Y_2O_3$. The excitation spectrum and the emission spectrum of Example 6 are illustrated in FIG. 4.

TABLE 3

| Example | x | M | z | maximum emission intensity (nm) | relative intensity |
|---|---|---|---|---|---|
| 6 | 0.5 | Mg | 0.1 | 574 | 3894 |
| 7 | 0.5 | Y | 0.1 | 577 | 1256 |

Example 8

Figure 5:
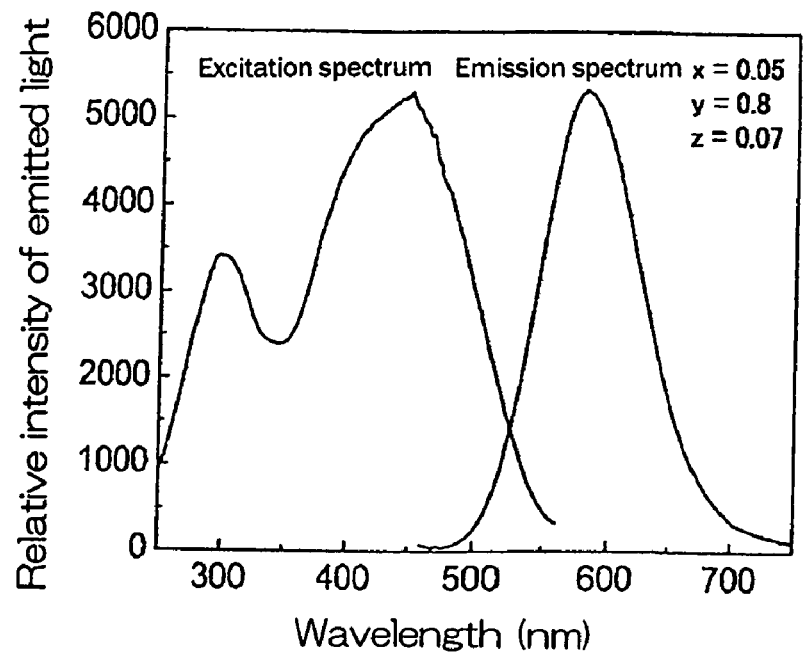
FIG. 5 is a graph illustrating the excitation spectrum and the emission spectrum of the lithium-containing α-sialon of Example 8.

$Li_2O$ was added to the starting material of powder of $Si_3N_4$—$AlN$—$Eu_2O_3$—$CaO$, which was same as that of Example 3, by 1.0 wt % and the mixture was heated under conditions same as those of Example 3. Table 4 and FIG. 5 show the emission characteristics of the obtained powder.

TABLE 4

| Example | x | y | z | maximum emission intensity (nm) | relative intensity |
|---|---|---|---|---|---|
| 8 | 0.05 | 0.8 | 0.07 | 581 | 5329 |

Examples 9 to 11

Figure 6:
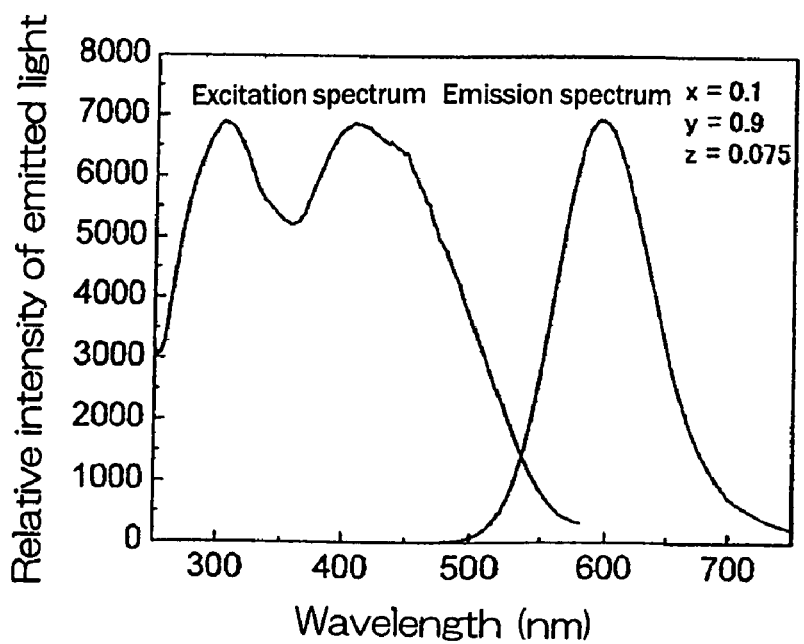
FIG. 6 is a graph illustrating the excitation spectrum and the emission spectrum of the lithium-containing α-sialon of Example 9.
Figure 7:
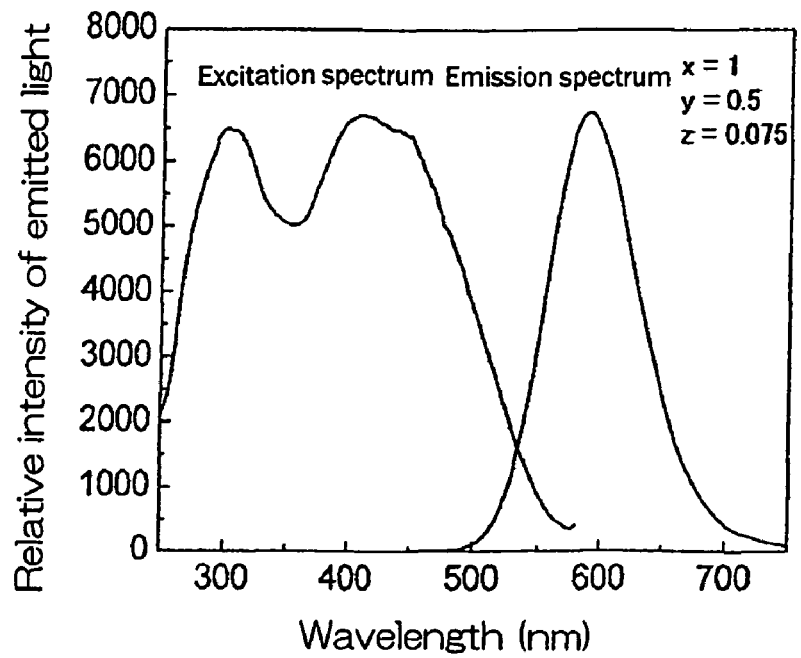
FIG. 7 is a graph illustrating the excitation spectrum and the emission spectrum of the lithium-containing α-sialon of Example 11.

In each of the examples, a mixture powder of $Si_3N_4$—AlN—EuN—$Ca_3N_2$—$Li_3N$, for which the values listed in Table 5 are selected for x, y, z of the general formula ($Li_x$, $Ca_y$, $Eu_z$) ($Si_{12-m}Al_m$) ($N_{16}$), was heated at 1,750° C. for 2 hours with 5 atmosphere of nitrogen. Table 5 shows the emission characteristics of the obtained sialon powders. The excitation spectrums and the emission spectrums of 1-5 Examples 9 and 11 are illustrated in FIGS. 6 and 7 respectively.

TABLE 5

| Example | x | y | z | maximum emission intensity (nm) | relative emission intensity |
|---|---|---|---|---|---|
| 9 | 0.1 | 0.9 | 0.075 | 596 | 6950 |
| 10 | 0.5 | 0.7 | 0.075 | 591 | 7320 |
| 11 | 1 | 0.5 | 0.075 | 586 | 6750 |

Examples 12 to 13

Figure 8:
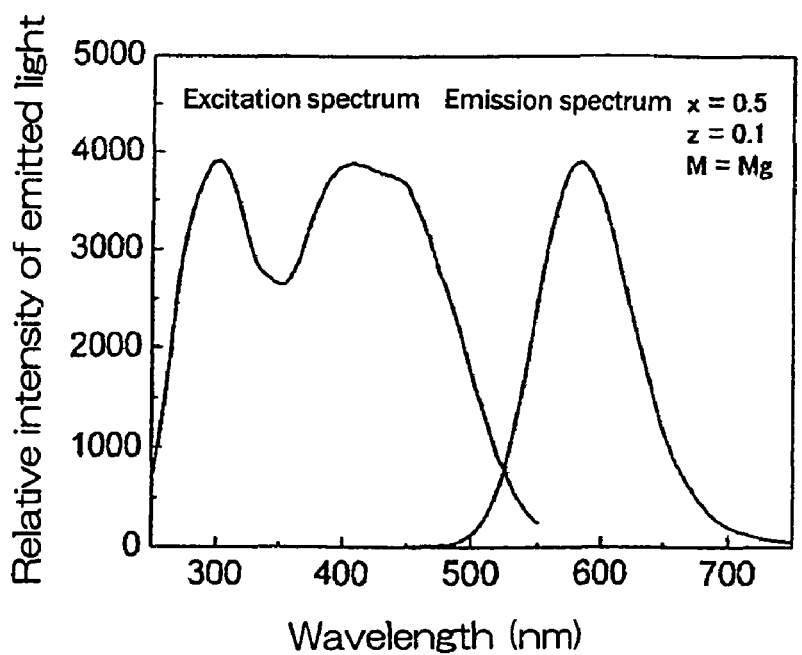
FIG. 8 is a graph illustrating the excitation spectrum and the emission spectrum of the lithium-containing α-sialon of Example 12.

In each of the examples, a mixture powder of $Si_3N_4$—AlN—EuN—$Ca_3N_2$—$Li_3N$-MN (where MN is a metal nitride), for which the values listed in Table 6 are selected for x, y, z of the general formula ($Li_x$, $Ca_y$, $Eu_z$) ($Si_{12-m}Al_m$) ($N_{16}$), was heated at 1,750° C. for 2 hours with 5 atmosphere of nitrogen. Table 6 shows the emission characteristics of the obtained sialon powders. The excitation spectrum and the emission spectrum of Example 12 are illustrated in FIG. 8.

TABLE 6

| Example | x | M | z | maximum emission intensity (nm) | relative intensity |
|---|---|---|---|---|---|
| 12 | 0.5 | Mg | 0.1 | 583 | 3912 |
| 13 | 0.5 | Y | 0.1 | 587 | 2452 |

Example 14

The lithium-containing α-sialon obtained in Example 4 was embedded in epoxy resin and arranged in front of a blue LED showing an emission wavelength of 460 nm. FIG. 9 illustrates the color tone of white light produced as a result of mixing blue excitation light and light emitted from the phosphor, using a color coordinate system. It was possible to shift the color of emitted light from 4,500K to 8,600K simply by changing the composition ratio of the phosphor.

Example 15

The lithium-containing α-sialon obtained in Example 4 was embedded in epoxy resin and arranged in front of a blue LED showing an emission wavelength of 460 nm. FIG. 10 illustrates the emission spectrum of white light obtained by mixing blue excitation light and light emitted from the phosphor. The characteristics of the light emitting device include color tone x=0.300, y=0.273, color temperature 7,500(K), average color rendering index Ra=74 and lamp efficiency 42.51 m/W.

Comparative Examples

For the purpose of comparison, the excitation wavelengths, the emission wavelengths and the relative intensities of YAG:Ce (Comparative Example 1), Li—Eu-α-sialon (Comparative Example 2, material corresponding to Patent Document 4) and Eu—Ca-α-sialon ($Ca_{0.3}Eu_{0.075}$) ($Si_{10.875}Al_{1.125}$) ($O_{0.375}N_{15.625}$) (Comparative Example 3, material corresponding to Patent Document 1) were observed. Table 7 below shows the obtained results.

As a result of the comparison, it was found that an lithium-containing α-sialon according to the present invention emits light with a wavelength longer than YAG:Ce. On other hand, the conventional Li—Eu-α-sialon and Eu—Ca-α-sialon showed a light emission intensity lower than a half of the material according to the present invention.

TABLE 7

| comparative example | excitation wavelength (nm) | maximum emission intensity (nm) | relative emission intensity |
|---|---|---|---|
| 1 | 460 | 566 | 5200 |
| 2 | 470 | 585 | 389 |
| 3 | 450 | 590 | 1500 |

INDUSTRIAL APPLICABILITY

A lithium-containing α-sialon phosphor according to the present invention shifts its excitation spectrum to the longer wavelength side than conventionally available oxide phosphors to superpose its wavelength range on the wavelength range (from 400 nm to 480 nm) of light emitted from a blue LED. Therefore, it is possible to provide a phosphor that can raise the luminance of white LEDs using a blue LED as source of excitation light. Additionally, since a lithium-containing α-sialon phosphor according to the present invention emits light with a spectrum range broader than any conventional α-sialon phosphors, it provides an advantage that a single phosphor can provide white light with various color tones. Therefore, a lithium-containing α-sialon phosphor according to the present invention can find applications in white light emitting devices that can accommodate a wide scope of needs. Still additionally, an α-sialon according to the present invention is developed as heat-resistant material, it is thermally, mechanically and chemically highly stable. Therefore, the present invention provides an α-sialon phosphor that can operate stably in a rigorous environment and highly resistant to light.

The invention claimed is:

1. A lithium-containing sialon phosphor expressed by general formula ($Li_x$, $Ca_y$, $Eu_z$) ($Si_{12-m}Al_m$) ($N_{16}$), wherein
the numerical ranges of x, y, z, and m are respectively 0<x<2.0, 0<y<2.0, 0<z≦0.5 (provided that 0.3≦x+y≦2.0), 0<m≦4.0.

2. A lithium-containing sialon phosphor, which is α-sialon expressed by general formula ($Li_x$, $M_y$, $Eu_z$) ($Si_{12-m}Al_m$) ($N_{16}$), wherein
the numerical ranges of x, y, z, and m are respectively 0<x<2.0, 0<y<2.0, 0<z≦0.5 (provided that 0.3≦x+y+z≦2.0), and 0<m≦4.0 (where M is Mg, Y, a lanthanide metal or a mixture of two or more than two of them).

3. A method of manufacturing the lithium-containing sialon phosphor according to claim 1, characterized in that it is synthesized by heating a mixture showing a composition expressed by $aSi_3N_4\text{-}bAlN\text{-}cLi_3N\text{-}dCa_3N_2\text{-}eEuN$, where the numerical ranges of a, b, c, d and e are respectively $8 \leq a < 12$, $0 < b \leq 12$, $0 < c < 3$, $0 < d < 2.5$, and $0 < e < 1$ in terms of mol ratio, as starting material at 1,500° C. to 2,000° C. for 0.5 to 48 hours in a nitrogen atmosphere.

4. A method of manufacturing the lithium-containing sialon phosphor according to claim 2, characterized in that it is synthesized by heating a mixture showing a composition expressed by $aSi_3N_4\text{-}bAlN\text{-}cLi_3N\text{-}dCa_3N_2\text{-}eEuN\text{-}fMN$ (where MN is metal nitride of Mg, Y, a lanthanide metal or a mixture of two or more than two of them), where the numerical ranges of a, b, c, d, e and f are respectively $8 \leq a < 12$, $0 < b \leq 12$, $0 < c < 3$, $0 < d < 2.5$, $0 < e < 1$ and $0 < f < 2$ in terms of mol ratio, as starting material at 1,500° C. to 2,000° C. for 0.5 to 48 hours in a nitrogen atmosphere.

5. The lithium-containing sialon phosphor according to claim 1, characterized in that the maximum value of the excitation wavelength is 380 nm to 480 nm and the maximum value of the emission wavelength is 580 nm to 610 nm.

6. A lithium-containing sialon phosphor for emitting white light with a high color rendering characteristic by exciting the phosphor according to claim 1, using blue light emitted from a blue LED with a wavelength of 400 nm to 480 nm as excitation light.

7. A white light emitting device for emitting white light by means of a blue LED of wavelength 400 nm to 480 nm comprising a gallium nitride compound semiconductor light emitting element and by mixing the emission spectrum of the light emitting element and light produced by converting the wavelength of part of the emitted light by means of the lithium-containing sialon phosphor according to claim 1.

8. A white light emitting device according to claim 7, characterized in that the average color rendering index Ra is within a range from 60 to 95 and the color temperature is from 2,000K to 8,700K.

* * * * *